(12) United States Patent
Wang et al.

(10) Patent No.: US 8,071,884 B2
(45) Date of Patent: Dec. 6, 2011

(54) FLEXIBLE PRINTED CIRCUIT BOARD HAVING CURVED EDGE

(75) Inventors: Ming Wang, Shenzhen (CN);
Dong-Qing He, Shenzhen (CN);
Xiao-Hong Zhang, Shenzhen (CN);
Cheng-Hsien Lin, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 896 days.

(21) Appl. No.: 12/106,513

(22) Filed: Apr. 21, 2008

(65) Prior Publication Data
US 2009/0014204 A1    Jan. 15, 2009

(30) Foreign Application Priority Data
Jul. 13, 2007   (CN) .......................... 2007 1 0076016

(51) Int. Cl.
*H05K 1/11*    (2006.01)
(52) U.S. Cl. ........ 174/254; 174/250; 361/749; 361/748; 361/750; 361/751; 361/776

(58) Field of Classification Search .......... 174/250–268; 361/748–804; 439/66, 77
See application file for complete search history.

(56) References Cited

U.S. PATENT DOCUMENTS

| 6,118,665 A * | 9/2000 | Kishida et al. ............... 361/749 |
| 2006/0027395 A1 * | 2/2006 | Cho ............................. 174/254 |

FOREIGN PATENT DOCUMENTS

| JP | 2002-50833 A | | 2/2002 |
| JP | 2002050833 A | * | 2/2002 |
| TW | 200719002 A | | 5/2007 |
| TW | 200723984 A | | 6/2007 |

* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

A flexible printed circuit board includes a base and a coverlay. The base includes a main portion and a distal portion connecting with the main portion. The distal portion has a first part and a second exposed part. The coverlay is formed on the base and covers the main portion and the first part of the distal portion. The second exposed part of the distal portion is uncovered by the coverlay. The coverlay includes a curved edge serving as an interface between the first part and second part of the distal portion.

8 Claims, 5 Drawing Sheets

FLEXIBLE PRINTED CIRCUIT BOARD HAVING CURVED EDGE

BACKGROUND OF THE INVENTION

1. Field of the Invention

The present invention relates to printed circuit boards and, particularly, to a flexible printed circuit board having excellent flexibility.

2. Description of Related Art

Nowadays, flexible printed circuit boards (FPCBs) are widely used in portable electronic devices such as mobile phones, digital cameras and personal digital assistants (PDAs). In some electronic devices, certain parts are movable relative to a main body. In these electronic devices, FPCBs can maintain an electrical connection between the main body and the movable parts due to their flexibility.

FIG. 5 shows a typical FPCB 10. The FPCB 10 includes a circuit area 11, a gold finger portion 12, and a coverlay 13. The coverlay 13 covers and is attached to the circuit area 11 and overlaps and is attached to the gold finger portion 12. A straight edge 14 of the portion of the coverlay 13 that overlaps the gold finger portion 12 is perpendicular to the extending direction of the gold finger portion 12. When the gold finger portion 12 is inserted into a connection socket of an electronic device, the force exerted by a user to insert the gold finger portion 12 may not (in fact usually is not) be longitudinally parallel to the gold finger portion 12 resulting in lateral stress being applied thereto. Thus stress will be concentrated where the straight edge 14 and the gold finger portion 12 meet, greatly raising the risk of damage to the gold finger portion 12.

Therefore, a flexible printed circuit board, which can overcome the above shortcomings, is desired.

SUMMARY OF THE INVENTION

An embodiment of a flexible printed circuit board includes a base and a coverlay. The base includes a main portion and a distal portion connecting with the main portion. The distal portion has a first part and a second exposed part. The coverlay is formed on the base and covers the main portion and the first part of the distal portion. The second exposed part of the distal portion is uncovered by the coverlay. The coverlay includes a curved edge serving as an interface between the first part and second part of the distal portion.

Advantages and novel features will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Embodiments will now be described in detail below and with reference to the drawings.

Figure 1:
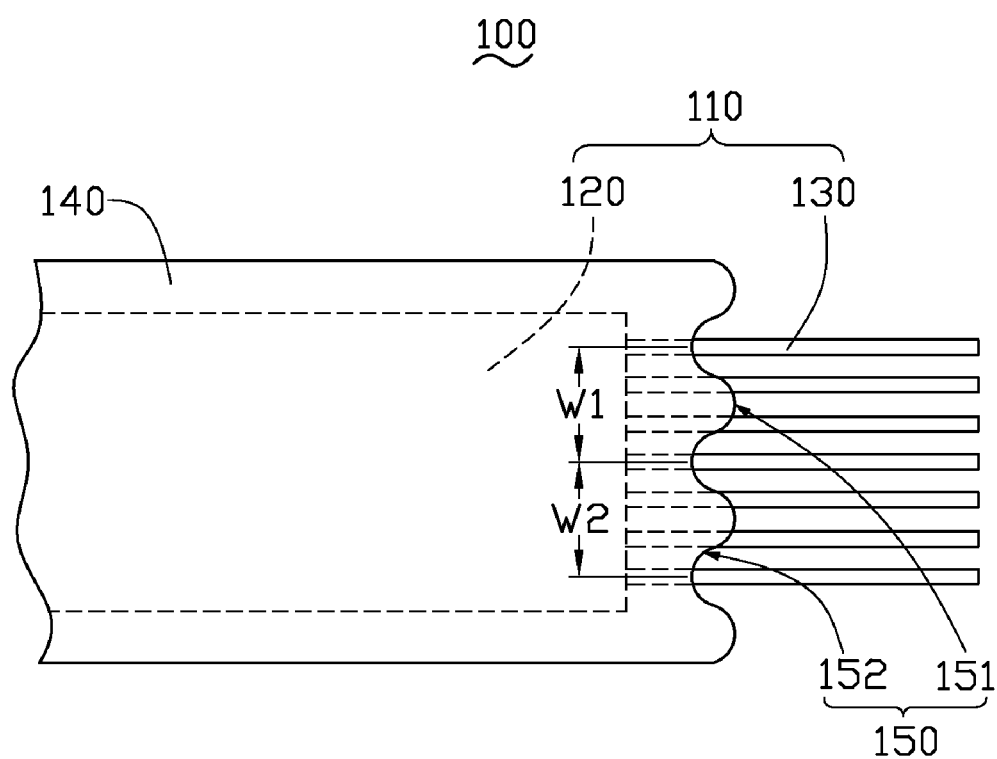
FIG. 1 is a schematic top view of a flexible printed circuit board, in accordance with a present first embodiment.

Referring to FIG. 1, a FPCB 100, in accordance with a first embodiment, is shown. The FPCB 100 includes a base 110 and a coverlay 140. The base 110 is a preform, having a desired configuration for the FPCB 100. For example, the base 110 has circuits, holes, and other desired configuration defined thereon. The base 110 includes a main portion 120 and at least one distal portion 130 connected with the main portion 120. The coverlay 140 is formed on a surface of the main portion 120. The distal portion 130 is configured for electrically connecting with an electronic device, or configured for being used as a bending/folding portion of the FPCB 100. For example, the distal portion 130 can be a bendable portion (e.g., a flexible portion relative to the main portion 120), gold finger portion, and so on.

In the present embodiment, the distal portion 130 is a gold finger portion. After circuits have been formed on the surface of the main portion 120, the coverlay 140 needs to be formed on the surface of the main portion 120 to cover and protect the circuits. Because the main portion 120 connects with the gold finger portion (i.e., the distal portion 130), when the coverlay 140 covers the main portion 120, it also overlaps a part of the distal portion 130. For example, the distal portion 130 includes a first part covered by the coverlay 140 and a second exposed part uncovered by the coverlay 140. The coverlay 140 has a curved edge 150 serving as an interface between the first part and the second exposed part of the distal portion 130. The curved edge 150 is configured with curves so as to distribute pressure or force applied by a user inserting the distal portion 130 into a receiving device (not shown) across a greater area of the distal portion 130 and along multiple vectors than would be otherwise if the curved edge 150 was a straight edge. In the present embodiment, the curved edge 150 is configured in a wavy pattern but may in other embodiments be zigzag, arced, or otherwise form a curved pattern.

Figure 2:
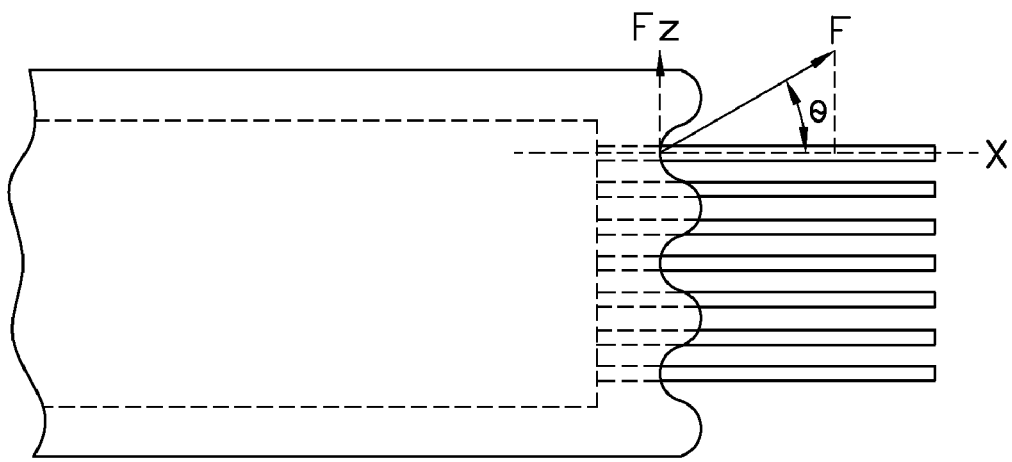
FIG. 2 is a schematic view, showing an external force occurring on a curved edge of a coverlay applied in the flexible printed circuit board of FIG. 1.

The curved edge 150 includes a number of ridges 151 and a number of troughs 152 disposed in an alternating manner. Referring to FIG. 2, an angle θ between each ridge 151 and a horizontal direction X (or an angle between each trough 152 and the horizontal direction X) is in a range from about 0.25 radians to about 0.5 radians. An external force occurring on the interlace between the first part and the second exposed part of the distal portion 130 is denoted by F, and a vertical component force vertical to the distal portion 130 (i.e., along a thickness direction of the distal portion 130) is denoted by $F_z$, therefore, $F_z = F*\sin θ$. Accordingly, due to the angle θ, the force occurring on the interface between the first part and the second exposed part of the distal portion 130 can be dispersed and reduced. In addition, because of the curved edge 150 having a various angle θ, forces occurring on the curved edge 150 are dispersed by the curved edge 150 along different angles. A width between two adjacent ridges 151 (denoted by $W_1$), and a width between two adjacent troughs 152 (denoted by $W_2$) is determined by a width of the gold fingers and a space between adjacent gold fingers of the gold finger portion (i.e., the distal portion 130).

In the present embodiment, the width of each gold finger is about 0.15 millimeters, and the space between adjacent gold fingers is about 0.15 millimeters. Four gold fingers are disposed between two adjacent ridges 151 or two adjacent troughs 152. That is, a sum of $W_1$ and $W_2$ is equal to or larger than 4*0.15+3*0.15 (a sum of the width of four gold fingers and three spaces between adjacent gold fingers). It is to be understood that configuration and size of the curved edge 150 and the gold finger portion (i.e., the distal portion 130) are predetermined according to the configuration and size of a desired electrical device, which the FPCB 100 applied thereto.

With respect to the FPCB 100 of the present embodiment, the curved edge 150 of the coverlay 140 overlapping the gold finger portion (i.e., the distal portion 130) is advantageous. When the gold finger portion (i.e., the distal portion 130) of the FPCB 100 is applied to an electrical device, the gold finger portion (i.e., the distal portion 130) is inserted into a connection socket of the electrical device under an external inserting/pressing force. Thus, a pair of action-reaction forces exist between the gold finger portion (i.e., the distal portion 130) and the coverlay 140, and are distributed in the curved edge 150. The pair of action-reaction forces are dispersed by the curved edge 150 along different angles. That is, because of the curved edge 150, the pair of action-reaction forces occurring on the gold fingers in the gold finger portion (i.e., the distal portion 130) cannot converge in a straight line perpendicular to the gold fingers in the gold finger portion (i.e., the distal portion 130). Thus, the gold fingers in the gold finger portion (i.e. the distal portion 130) cannot deform and are able to maintain their original shape, thereby increasing the integrity and reliability of the electrical connection of the FPCB 100.

Figure 3:
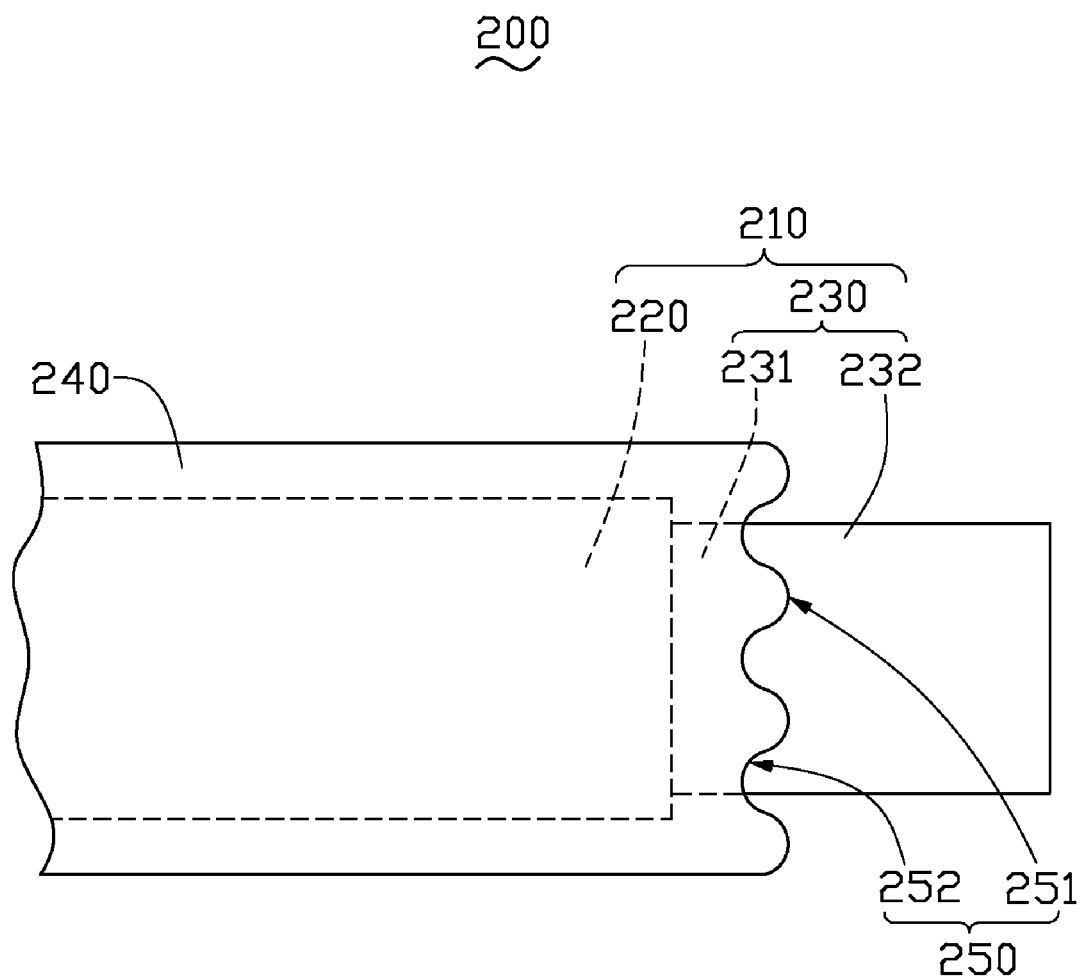
FIG. 3 is a schematic top view of a flexible printed circuit board, in accordance with a present second embodiment.

Referring to FIG. 3, a step-shaped multi-layered FPCB 200, in accordance with a second embodiment, is shown. The step-shaped multi-layered FPCB 200 includes a base 210 and a coverlay 240. The base 210 includes a first base portion 220 and a second base portion 230 connected with the first base portion 220. A thickness of the first base portion 220 is larger than a thickness of the second base portion 230. In other words, a number of layers of the first base portion 220 is larger than the number of layers of the second base portion 230. Thus, a thickness difference is formed between the first base portion 220 and the second base portion 230, and a step-shaped area is defined by the connection portion of the first base portion 220 and the second base portion 230. As a result, the second base portion 230 is movable or bendable relative to the first base portion 220. That is, the second base portion 230 is a bendable portion of the base 210, and the first base portion 220 is a main portion.

After circuits have been formed on surfaces of the step-shaped multi-layered FPCB 200, a coverlay needs to be formed on the surfaces of the step-shaped multi-layered FPCB 200 to protect the circuits. Due to the presence of the thickness difference, one sheet of coverlay is not suitable for covering and protecting the first base portion 220 and the second base portion 230 having different thickness, because an interstice is formed between the step-shaped area and the coverlay, thereby affecting sequential processes (e.g., plating, cleaning, etc) of treating the step-shaped multi-layered FPCB 200. For the sake of eliminating the interstice of the step-shaped area and the coverlay, two coverlays are separately formed on the first base portion 220 and the second base portion 230 having different thickness. Thus, the two coverlays separately combine with the first base portion 220 and the second base portion 230 and cover/protect them separately. For example, the coverlay 240 is formed on a surface of the first base portion 220, and the coverlay formed on the second base portion 230 is not shown for facility of describing a relationship of the coverlay 240 and the second base portion 230. The second base portion 230 includes a first part 231 and second exposed part 232. The coverlay 240 covers the first part 231 and the second exposed part 232 is uncovered by the coverlay 240. The coverlay 240 has a curved edge 250 serving as an interface between the first part 231 and the second exposed part 232 of the second base portion 230. The curved edge 250 is not limited to be waved, zigzag, arced, or other appropriate curved surface.

The curved edge 250 includes a number of ridges 251 and a number of troughs 252 disposed in an alternating manner. An angle θ between each ridge 251 and a horizontal direction (or an angle between each trough 252 and the horizontal direction) is in a range from about 0.3 radian to about 1 radian. It is to be understood that configurations and sizes of the ridges 251 and troughs 252 are predetermined accommodate to the step-shaped multi-layered FPCB 200 having required configuration and size.

In the step-shaped multi-layered FPCB 200 of the present embodiment, the curved edge 250 of the coverlay 240 formed on the surface of the first base portion 220 and the second base portion 230 is a curved surface. Because the thickness of the second base portion 230 is less than that of the first base portion 220, a flexibility of the second base portion 230 is higher than that of the first base portion 220. Thus, the second base portion 230 is bendable relative to the first base portion 220. When the step-shaped multi-layered FPCB 200 is applied to a communication product such as a slidable or a foldable mobile phone, the second base portion 230 can be bent repeatedly in the practical application. In the bending process of the second base portion 230, a pair of action-reaction forces generating between the second base portion 230 and the curved edge 250 of the coverlay 240 distribute in the curved edge 250. Because the curved edge 250 is configured with curves so as to distribute the action-reaction forces across a greater area of the curved edge 250 and along multiple vectors than would be otherwise if the curved edge 250 was a straight edge. Thus, the force produced on the second base portion 230 cannot converge in a straight line perpendicular to the width of the second base portion 230. Hence, the second base portion 230 cannot be deformed/damaged, and can maintain its original shape, thereby increasing an integrity or a credibility of the electrical connection of the step-shaped multi-layered FPCB 200. In the present embodiment, the curved edge 250 is configured in a wavy pattern but may in other embodiments be zigzag, arced, or otherwise form a curved pattern.

Figure 4:
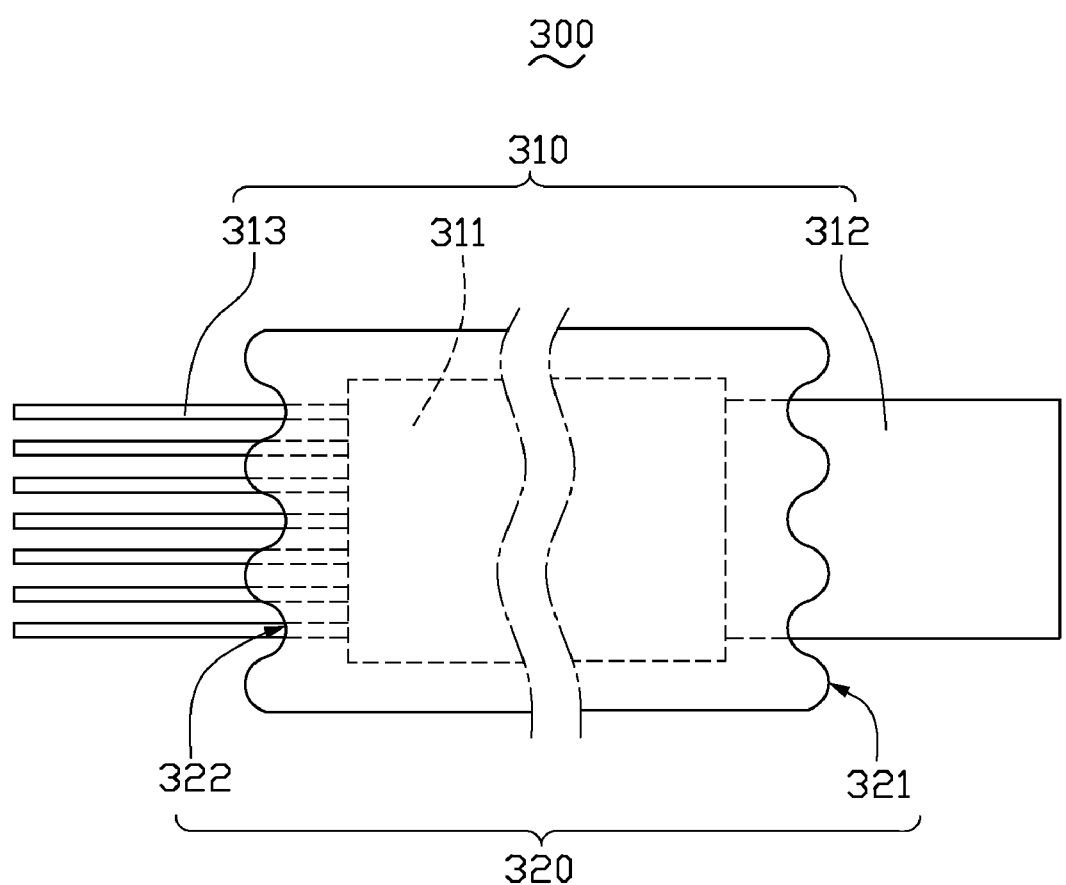
FIG. 4 is a schematic top view of a flexible printed circuit board, in accordance with a present third embodiment.
Figure 5:
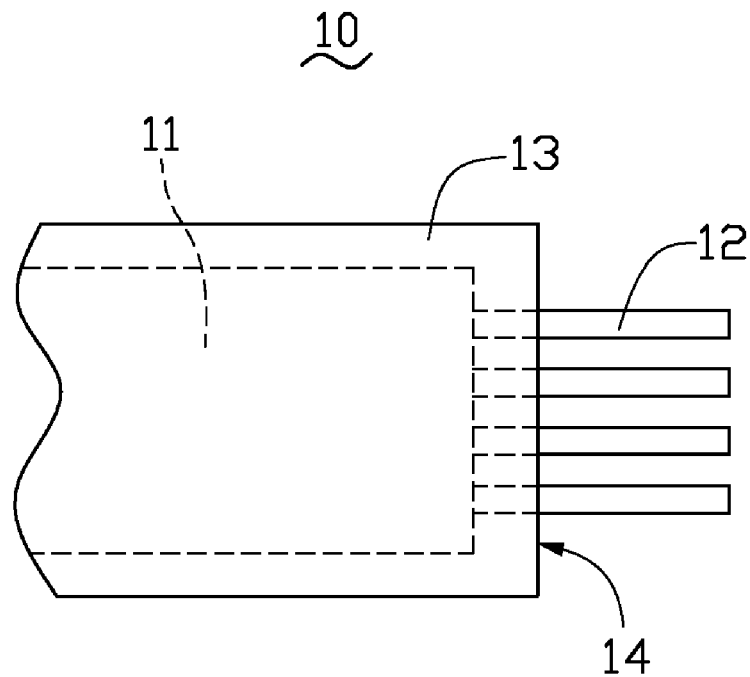
FIG. 5 is a schematic top view of a flexible printed circuit board, in accordance with a related art.

Referring to FIG. 4, a FPCB 300 in accordance with a third embodiment, is shown. The FPCB 300 includes a base 310 and a coverlay 320. The base 310 includes a first base portion 311, a second base portion 312, and a gold finger portion 313. The second base portion 312 connects with one end of the first base portion 311, and the gold finger portion 313 connects with the other end of the first base portion 311. A thickness of the first base portion 311 is larger than a thickness of the second base portion 312, thus a step-shaped (i.e., a thickness difference) area is formed between the first base portion 311 and the second base portion 312. The second base portion 312 includes a first part covered by the coverlay 320 and a second exposed part uncovered by the coverlay 320. The gold finger portion 313 includes a third part covered by the coverlay 320 and a fourth exposed part uncovered by the coverlay 320. The coverlay 320 includes a first curved edge 321 serving as an interface between the first part and the second exposed part of the first base portion 311, and a second curved edge 322 serving as an interface between the third part and the fourth exposed part of the gold finger portion 313. Both of the first curved edge 321 and the second curved edge 322 are configured in a wavy shape but may in other embodiments be zigzagged, arced, or otherwise form a curved pattern.

Configuration and size of the first curved edge 321 of the present embodiment are identical with those of the curved edge 250 of the second embodiment. The configuration and size of the second curved edge 322 of the present embodiment are identical with those of the curved edge 150 of the first embodiment. In addition, configuration and size of the first curved edge 321 are identical with configuration and size of the second curved edge 322. Properly, configuration and size of the first curved edge 321 accommodate to those of the second base portion 312 of the base 310. Similarly, configuration and size of the first curved edge 321 accommodate to those of the gold finger portion 313 of the base 310. It is to be understood that any potential variances in the configuration and size of each of the first curved edge 321 and second curved edge 322 are considered to be within the scope of the present FPCB 300, so long as the first curved edge 321 and second curved edge 322 can disperse/weaken the force acting/happening/occurring on the second base portion 312 and the gold finger portion 313.

In the application of the FPCB 300, for example, the gold finger portion 313 is inserted into a connection socket of a communication product, because the second curved edge 322 is a curved surface, the inserting/pressing force distributed on the second curved edge 322 is dispersed along different angles, thereby the inserting/pressing force happening on the gold finger portion 313 cannot converge in a straight line perpendicular to the gold fingers in the gold finger portion 313. Thus, the gold fingers in the gold finger portion 313 cannot deform and maintain their original shape, thereby increasing a credibility of the electrical connection of the FPCB 300. In addition, when the second base portion 312 is bent repeatedly in the practical application, a pair of action-reaction forces generating between the second base portion 312 and the first curved edge 321 are distributed in the first curved edge 321. Because the first curved edge 321 is configured with curves so as to distribute the action-reaction forces across a greater area of the curved first curved edge 321 and along multiple vectors than would be otherwise if the first curved edge 321 was a straight edge. Thus, the force generating on the second base portion 312 cannot converge in a straight line perpendicular to the width of the second base portion 312. Hence, the second base portion 312 cannot deform or be damaged, thereby increasing a credibility of the electrical connection of the FPCB 300.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible printed circuit board comprising:
   a base comprising a first base portion, a second base portion connecting with one end of the first base portion, and a gold finger portion connecting with another end of the first base portion, a thickness of the first base portion being larger than a thickness of the second base portion, the second base portion being bendable relative to the first base portion, the second base portion having a first part and a second exposed part, the gold finger portion having a third part and a fourth exposed part; and
   a coverlay formed on the first base portion and covering the first base portion, the first part of the second base portion and the third part of the gold finger portion, the second exposed part and the fourth exposed part being uncovered by the coverlay, the coverlay comprising a first curved edge serving as an interface between the first part and the second exposed part of the second base portion, and a second curved edge serving as an interface between the third part and the fourth exposed part of the gold finger portion.

2. The flexible printed circuit board as claimed in claim 1, wherein the first curved edge includes a plurality of ridges and troughs, at most four gold fingers being arranged between the adjacent ridges or adjacent troughs.

3. The flexible printed circuit board as claimed in claim 1, wherein the first curved edge is wavy, zigzagged, or arced.

4. The flexible printed circuit board as claimed in claim 1, wherein an angle $\theta$ between each trough and a horizontal direction is in a range from about 0.3 radians to about 1 radian.

5. The flexible printed circuit board as claimed in claim 1, wherein the second curved edge includes a plurality of ridges and troughs, at most four gold fingers being arranged between the adjacent ridges or adjacent troughs.

6. The flexible printed circuit board as claimed in claim 5, wherein the second curved edge is wavy, zigzagged, or arced.

7. The flexible printed circuit board as claimed in claim 5, wherein an angle $\theta$ between each ridge and a horizontal direction is in a range from about 0.25 millimeters to about 0.5 millimeters.

8. The flexible printed circuit board as claimed in claim 5, wherein an angle $\theta$ between each trough and a horizontal direction is in a range from about 0.25 millimeters to about 0.5 millimeters.

* * * * *